US005568438A

United States Patent [19]
Penchuk

[11] Patent Number: 5,568,438
[45] Date of Patent: Oct. 22, 1996

[54] SENSE AMPLIFIER WITH OFFSET AUTONULLING

[75] Inventor: Robert A. Penchuk, Wrentham, Mass.

[73] Assignee: Analog Devices, Inc., Norwood, Mass.

[21] Appl. No.: 503,529

[22] Filed: Jul. 18, 1995

[51] Int. Cl.[6] .................................................. G11C 7/00
[52] U.S. Cl. ............................. 365/208; 327/52; 327/54
[58] Field of Search .................................. 365/205, 207, 365/208, 203; 327/51, 52, 53, 54

[56] References Cited

U.S. PATENT DOCUMENTS

| | | | |
|---|---|---|---|
| 4,547,685 | 10/1985 | Wong | 365/208 |
| 4,724,344 | 2/1988 | Watanabe | 327/53 |
| 4,952,826 | 8/1990 | Hoshi | 365/205 |
| 4,973,864 | 11/1990 | Nogami | 365/205 |
| 5,473,567 | 12/1995 | McClure | 365/208 |

OTHER PUBLICATIONS

P. Gillingham et al, "High–Speed, High–Reliability Circuit Design for Megabit DRAM", IEEE Journal of Solid State Circuits, vol. 26, No. 8, Aug. 1991, pp. 1171–1175.
T. Sugibayashi et al, ISSCC95 Digest of Technical Papers, Feb. 17, 1995, pp. 254–255.
T. Sugibayashi et al, ISSCC Slide Supplement, Feb. 1995, pp. 196–197.

Primary Examiner—David C. Nelms
Assistant Examiner—Son Mai
Attorney, Agent, or Firm—Wolf, Greenfield & Sacks, P.C.

[57] ABSTRACT

A sense amplifier for determining the state of a memory cell of a random access memory includes first and second transistors connected in a differential amplifier configuration. The first and second transistors have control electrodes coupled to Bit and Bit B lines, respectively, for sensing a state of the memory cell. The sense amplifier further includes third and fourth transistors connected in a differential amplifier configuration. The differential amplifier configuration has an offset error and provides differential outputs for indicating the state of the memory cell during a read phase. The sense amplifier further includes first and second capacitors respectively coupled between the control electrodes of the third and fourth transistors and a reference potential, and a feedback circuit for coupling voltages representative of the offset error to the first and second capacitors during a nulling phase in which the Bit and Bit B lines are not being read. The first and third transistors may be connected in series or in parallel. Similarly, the second and fourth transistors may be connected in series or in parallel. By nulling offset error, the access time of the RAM is reduced.

17 Claims, 3 Drawing Sheets

1

SENSE AMPLIFIER WITH OFFSET AUTONULLING

FIELD OF THE INVENTION

This invention relates to sense amplifiers for random access memories and, more particularly, to sense amplifiers with nulling of offset errors using feedback techniques.

BACKGROUND OF THE INVENTION

A typical random access memory (RAM) includes an array of rows and columns of memory cells. A row of memory cells is accessed by activating a word line. The memory cells in each column are connected by Bit and inverted bit (Bit B) lines to a sense amplifier. During a read access of the memory, the sense amplifier determines the state of the memory cell having an active word line. The memory may include a sense amplifier for each memory cell along a word line. In another configuration, two or more sets of Bit and Bit B lines may be multiplexed to a sense amplifier.

One of the key parameters of a RAM is its access time. The access time for a memory cell is the sum of several components, including the time to activate the word line, the time to transfer the signal from the memory cell to the Bit and Bit B lines and the time to sense the Bit and Bit B lines with the sense amplifier. In a typical 4 megabit, 100 MHz RAM, the voltage change on an active Bit line is typically about 100 millivolts, and the potential develops on the Bit and Bit B lines at a rate of about 30 millivolts per nanosecond. Thus, approximately 3 nanoseconds, which represents 30% of the access time, are required to develop 100 millivolts on the Bit and Bit B lines. Sense amplifiers typically are configured as differential amplifiers which may have an offset error on the order of 10–20 millivolts. Since the bit line potential must overcome the offset error in order to switch the sense amplifier, the access time is increased for one of the states of the memory cell. The remainder of the access time is dominated by row decoder and word line activation, both of which are typically reduced by using lower resistance interconnect, metal strapping and/or by segmentation of the chip.

A high speed DRAM wherein bit lines are precharged to one half the supply voltage for faster sensing is disclosed by P. Gillingham et al. in IEEE Journal of Solid State Circuits, Vol. 26 No. 8, August 1991, pp. 1171–1175. A DRAM configuration wherein sense amplifier offset is stored on the bit lines is described by T. Sugibayashi et al in ISSCC95 Digest of Technical Papers, Feb. 17, 1995, pps. 254 and 255.

SUMMARY OF THE INVENTION

According to the present invention, a sense amplifier for determining the state of a memory cell of a random access memory is provided. The memory cell has Bit and Bit B lines connected thereto. The sense amplifier comprises first and second transistors connected in a differential amplifier configuration. The first and second transistors have control electrodes coupled to the Bit and Bit B lines, respectively, for sensing the state of the memory cell. The sense amplifier further comprises third and fourth transistors connected in the differential amplifier configuration. The differential amplifier configuration has an offset error and provides first and second differential outputs for indicating the state of the memory cell during a read phase. The sense amplifier further comprises first and second capacitors respectively coupled between control electrodes of the third and fourth transistors and a reference potential, a feedback circuit for coupling voltages representative of the offset error to the first and second capacitors during a nulling phase in which the Bit and Bit B lines are not being read, and a bias circuit for biasing the first, second, third and fourth transistors for operation during the read phase and the nulling phase.

In first and second embodiments, the third transistor is connected in series with the first transistor in a cascode arrangement, and the fourth transistor is connected in series with the second transistor in a cascode arrangement. The positions of the first and third transistors may be interchanged, and the positions of the second and fourth transistors may be interchanged in the cascode arrangement. In a third embodiment, the third transistor is connected in parallel with the first transistor, and the fourth transistor is connected in parallel with the second transistor.

The feedback circuit may comprise a fifth transistor coupled between the first differential output and the gate of the third transistor, a sixth transistor coupled between the second differential output and the gate of the fourth transistor, and a control circuit for switching the fifth and sixth transistors on during the nulling phase and for switching the fifth and sixth transistors off during the read phase.

The sense amplifier preferably further includes a bit line equalization circuit coupled to the Bit and Bit B lines for precharging the Bit and Bit B lines to equal voltages during a precharge phase. Preferably, the nulling phase and the precharge phase are concurrent. Peak currents may be reduced, if necessary, by nulling each sense amplifier or group of sense amplifiers in the RAM at different times, in a distributed manner.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
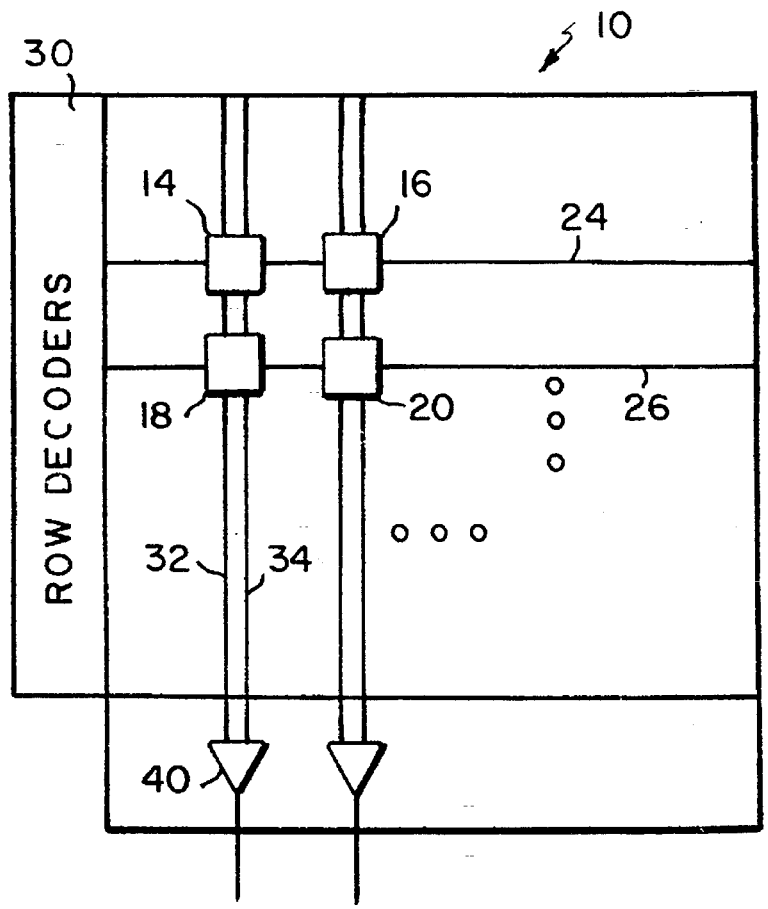
FIG. 1 is a schematic representation of a random access memory suitable for incorporation of the sense amplifier of the present invention.

A partial block diagram of an example of a random access memory (RAM) 10 suitable for incorporation of the present invention is shown schematically in FIG. 1. Memory cells 14, 16, 18, 20, etc. are arranged in an array of rows and columns. A typical RAM contains a large number of memory cells. The memory cells in each row are connected to a word line. Thus, for example, memory cells 14 and 16 are connected to word line 24, and memory cells 18 and 20 are connected to word line 26. Row decoders 30 activate one of the word lines during reading or writing. The memory cells in each column are connected to Bit and inverted bit (Bit B) lines. Thus, for example, memory cells 14 and 18 are connected to Bit line 32 and to Bit B line 34. The Bit line 32 and the Bit B line 34 are connected to a sense amplifier 40. The sense amplifier senses potentials on the Bit and Bit B lines and provides an output that is indicative of the state of the memory cell having an active word line. Thus, for example, when word line 24 is active, sense amplifier 40 provides an output indicative of the state of memory cell 14. In another configuration, two or more sets of bit lines may be multiplexed to a sense amplifier, under control of a column decoder.

It will be understood that random access memories may have a variety of different configurations. The present invention is applicable to RAMs which have Bit and Bit B lines connected to memory cells for sensing the state of the memory cell. The present invention is particularly applicable to static random access memories (SRAMs).

Figure 2:
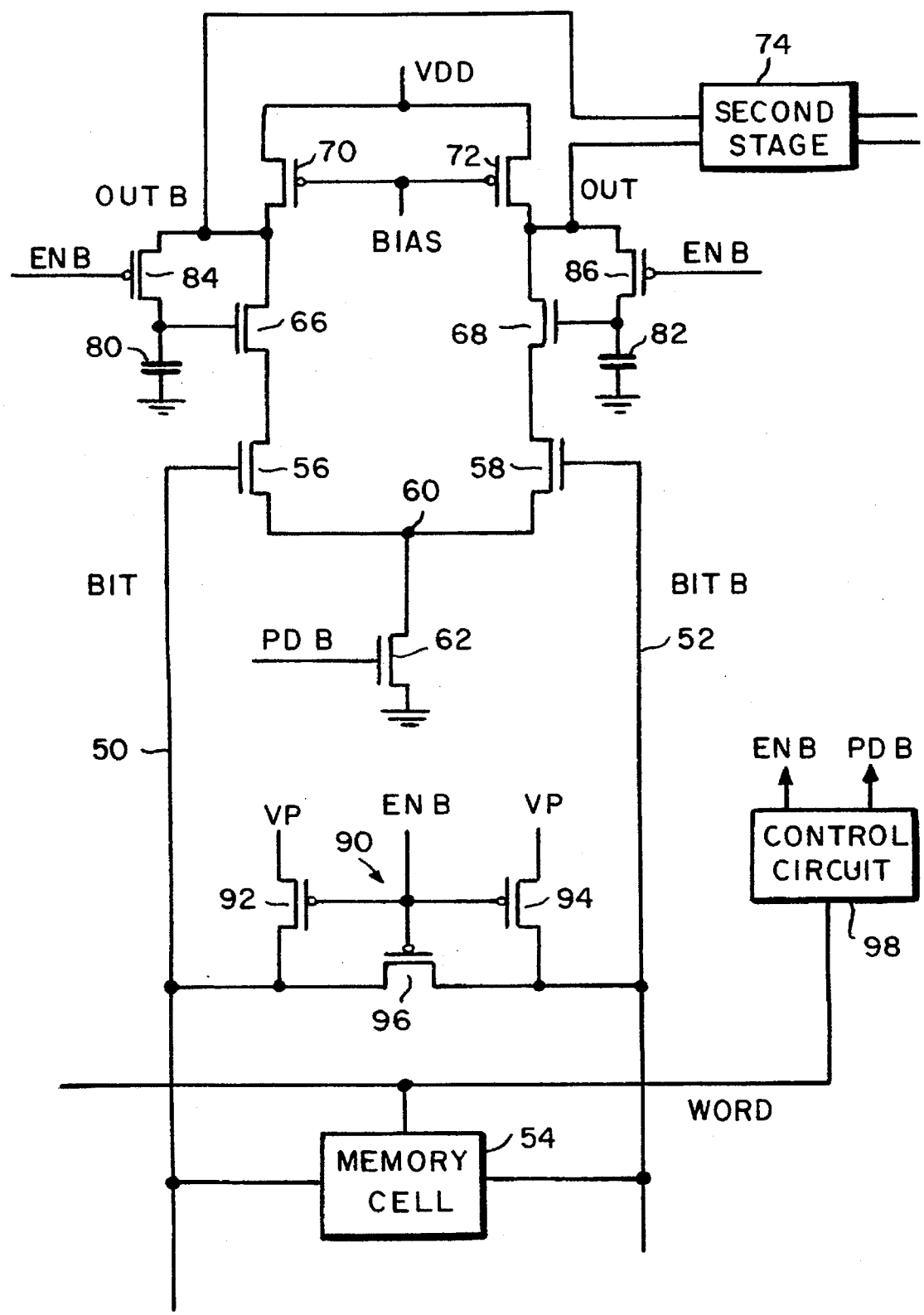
FIG. 2 is a schematic diagram of a first embodiment of a sense amplifier in accordance with the present invention.

A schematic diagram of a first embodiment of a sense amplifier in accordance with the present invention is shown in FIG. 2. A Bit line 50 and a Bit B line 52 are selectively connected to a memory cell 54 in an array of memory cells. The Bit line 50 is connected to the gate of a transistor 56, and the Bit B line 52 is connected to the gate of a transistor 58. The sources of transistors 56 and 58 are connected to a node 60 in a differential amplifier configuration. The node 60 is connected to ground through a bias transistor 62. The drain of transistor 56 is connected to the source of a transistor 66 in a cascode arrangement. The drain of transistor 58 is connected to the source of a transistor 68 in a cascode arrangement. The drain of transistor 66 is connected through a bias transistor 70 to a supply voltage VDD. The drain of transistor 68 is connected through a bias transistor 72 to supply voltage VDD. The transistors 56, 58, 62, 66, 68, 70 and 72 constitute a differential amplifier. Differential outputs OUT B and OUT of the amplifier appear at the drains of transistors 66 and 68, respectively. The differential outputs OUT and OUT B are typically connected to a second stage 74 of the sense amplifier that provides a required load driving capability. The transistors 62, 70 and 72 constitute a bias circuit for biasing the transistors 56, 58, 66 and 68 of the differential amplifier during operation. In the example of FIG. 2, the transistors 56, 58, 62, 66 and 68 are N-type MOS transistors, and transistors 70 and 72 are P-type MOS transistors.

As is known in the art, any differential amplifier has an offset error due to process variations, aging, temperature variations and the like. By compensating for aging, field reliability is improved. A typical offset error is on the order of 10–20 millivolts. In the context of a sense amplifier for a RAM, the offset error appears as a threshold imbalance. That is, the threshold voltage for detecting a "1" state of the memory cell is different from the threshold voltage for detecting a "0" state of the memory cell. The offset error causes different access times for 1 and 0 states of the memory cell, because the threshold levels of the differential amplifier are reached at different times, depending on the state of the memory cell.

In accordance with the present invention, the sense amplifier includes circuitry for automatically nulling the offset error. A capacitor 80 is connected between the gate of transistor 66 and a reference potential, such as ground. A capacitor 82 is connected between the gate of transistor 68 and a reference potential, such as ground. A transistor 84 has a source connected to the drain of transistor 66 and a drain connected to the gate of transistor 66 and to capacitor 80. A transistor 86 has a source connected to the drain of transistor 68 and a drain connected to the gate of transistor 68 and to capacitor 82. The transistors 84 and 86 function as electronically controlled switches for connecting the respective differential outputs of the sense amplifier to the capacitors 80 and 82 during a nulling phase of operation when the memory cell 54 is not being read. The transistors 84 and 86 may be P-type MOS transistors. As described below, the transistors 84 and 86 and capacitors 80 and 82, in conjunction with cascode transistors 66 and 68, provide nulling of offset errors in the sense amplifier.

The sense amplifier preferably includes a bit line equalization circuit 90 coupled to the Bit line 50 and to the Bit B line 52. A transistor 92 is connected between a precharge voltage VP and Bit line 50. A transistor 94 is connected between precharge voltage VP and Bit B line 52. A transistor 96 is connected between the Bit line 50 and the Bit B line 52. The transistors 92, 94 and 96 may be P-type MOS transistors, each of which receives an inverted enable (EN B) control signal that is active during a precharge phase of operation. When the control signal is active, the transistors 92, 94 and 96 are turned on. During the precharge phase, the Bit line 50 and the Bit B line 52 are connected to the precharge voltage VP and are connected to each other. In a preferred embodiment, the precharge voltage VP is one-half of supply voltage VDD. Thus, for example, when the supply voltage VDD is 5.0 volts, the precharge voltage VP may be 2.5 volts.

Figure 3:
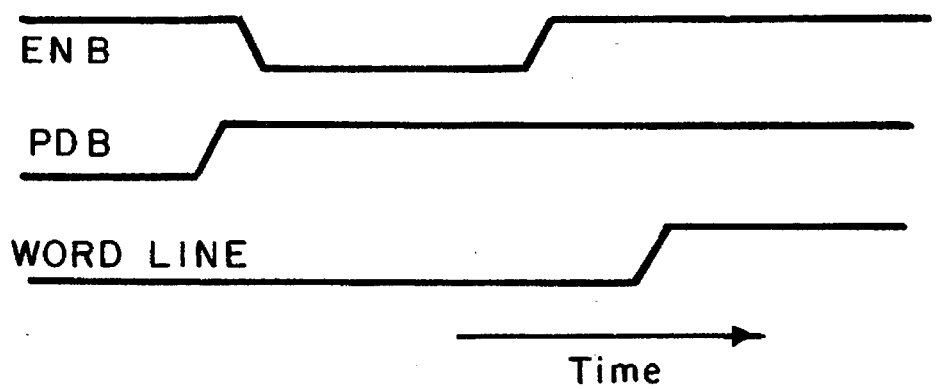
FIG. 3 is a timing diagram of the control signals associated with the sense amplifier of FIG. 2.

Typical timing signals for operation of the sense amplifier of FIG. 2 are shown in FIG. 3. The EN B control signal is applied to the gates of transistors 84 and 86 in the offset error nulling circuit and to the gates of transistors 92, 94 and 96 in the bit line equalization circuit 90. The EN B control signal is generated by a control circuit 98 that controls operation of the RAM. When the EN B signal is low, the word line connected to memory cell 54 is inactivated to inhibit reading of the memory cell. When the EN B signal is low, the transistors 92, 94 and 96 of the bit line equalization circuit are switched on, causing Bit line 50 and Bit B line 52 to be precharged to the precharge voltage VP.

In addition, the transistors 84 and 86 are switched on when the EN B signal is low. The transistor 84 applies the voltage at the drain of transistor 66 to capacitor 80, and the transistor 86 applies the voltage at the drain of transistor 68 to capacitor 82. Since the inputs to the sense amplifier on Bit line 50 and Bit B line 52 are equal due the activation of bit line equalization circuit 90, the differential outputs OUT and OUT B at the drains of transistors 68 and 66 represent the offset error of the sense amplifier. The differential outputs are connected by the transistors 84 and 86 to the capacitors 80 and 82, respectively, and to the gates of transistors 66 and 68.

The feedback arrangement causes the offset error to be nulled. In particular, if the offset error causes the output voltage to be higher than its nominal value, that higher voltage is applied to the gate of transistor 68 and causes additional current flow through transistor 68 and a decrease in the output voltage to its nominal voltage. Conversely, if the output voltage is lower than its nominal value, that lower voltage is applied to the gate of transistor 68 and causes reduced current flow through transistor 68 and an increase in the output voltage to its nominal voltage. The nulling circuit including transistors 66 and 84 and capacitor 80 operates in the same manner. When the EN B control signal is inactivated to a high state during reading of the memory cell, transistors 84 and 86 are switched off, and the required feedback voltages are stored on capacitors 80 and 82. The stored voltages on capacitors 80 and 82 are applied to the gates of transistors 66 and 68, respectively, during reading of the memory cell 54, thereby substantially nulling the offset error.

As shown in FIG. 3, the word line connected to memory cell 54 is in an active high state during a time that does not overlap the EN B control signal. During the read phase of operation when the word line is active, the capacitors 80 and 82 retain the appropriate voltages for nulling offset error, and the transistors 84 and 86 remain off. Precharging of the Bit line 50 and the Bit B line 52 and offset error nulling are performed simultaneously during the active state of the EN B control signal in the embodiment of FIGS. 2 and 3. By way of example, the precharging and nulling operations can be repeated at 4 millisecond intervals. It will be understood that different intervals can be used, depending on the values of capacitors 80 and 82 and the desired offset nulling accuracy. Peak currents may be reduced, if necessary, by nulling each sense amplifier or group of sense amplifiers in the RAM at different times, in a distributed manner.

The capacitance values of capacitors 80 and 82 are selected to hold the threshold adjustment value within a desired accuracy after leakage. A one millivolt differential between capacitors 80 and 82, with a 200 millivolt droop on both is considered reasonable. The accuracy may be changed by changing the ratios of transistors 66 and 68 to transistors 56 and 58. The minimum value of capacitance should be at least an order of magnitude larger than the gate to drain overlap capacitance of transistors 84 and 86. Some immunity to capacitor voltage decay is provided by the common mode rejection properties of the sense amplifier. The maximum value of capacitance is limited by area constraints and should be selected such that the capacitors fit within the pitch of a memory bit line pair. A practical range for capacitance values is about 0.1 to 1.0 picofarad. However, other capacitance values may be used within the scope of the present invention. A larger capacitor requires less frequent refreshing and thus reduces power. However, a larger capacitor requires more chip area and requires more time to charge. In an example of the sense amplifier shown in FIG. 2, the supply voltage VDD is 5.0 volts and the bias voltage applied to the gates of transistors 70 and 72 is 0 volts. The sense amplifier is enabled by application of an inverted powerdown (PD B) signal of 5 volts to the gate of transistor 62. Different bias circuit arrangements can be used within the scope of the present invention. For example, transistors 70 and 72 can be replaced with a current mirror circuit. Also, the transistors 70 and 72 can be controlled by the PD B signal. The Bit line 50 and the Bit B line 52 are preferably precharged to equal voltages of 2.5 volts. Different precharge voltages can be utilized within the common mode range of the sense amplifier. In the nulling and precharge phase of operation, the voltage at node 60 is typically on the order of 1.0 volts, and the voltages at outputs OUT and OUT B are on the order of 3.0 to 3.5 volts. During the read phase of operation, the memory cell 54 causes the Bit line 50 and the Bit B line 52 to differ by about 100 millivolts. The differential voltage applied to transistors 56 and 58 causes the differential outputs OUT and OUT B to change in proportion to the gain of the differential amplifier. As noted above, the offset error voltages stored on capacitors 80 and 82 cause the sense amplifier to have substantially equal thresholds for either state of the memory cell 54.

Figure 4:
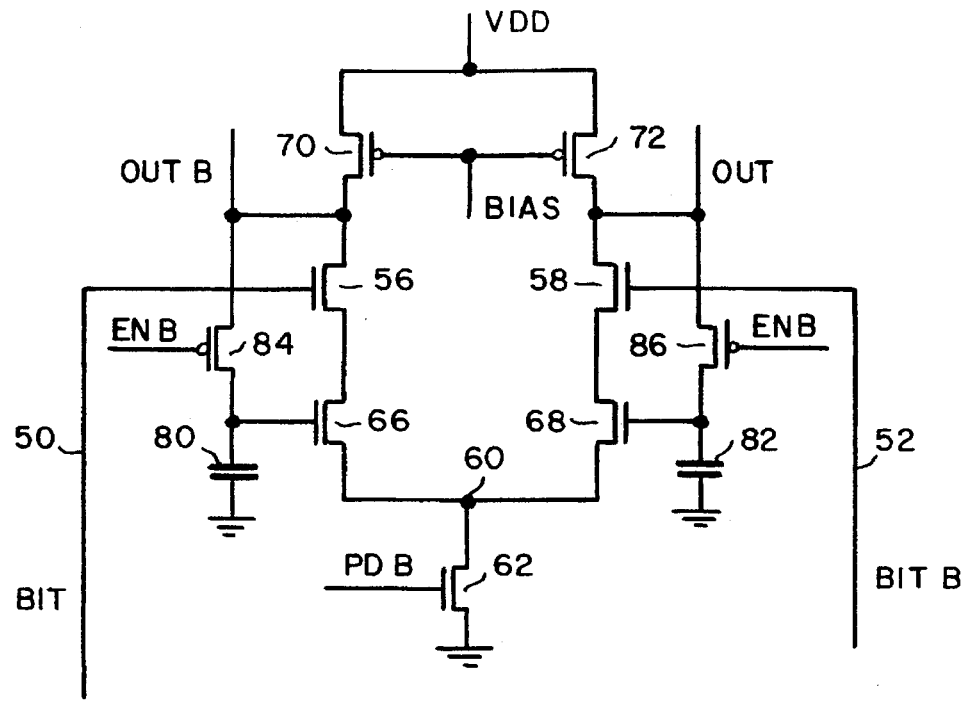
FIG. 4 is a schematic diagram of a second embodiment of the sense amplifier of the present invention.

A second embodiment of the sense amplifier of the present invention is shown in FIG. 4. Like elements in FIGS. 2 and 4 have the same reference numerals. The memory cell 54, the bit line equalization circuit 90, the control circuit 98 and the second stage 74 have been omitted from FIG. 4 for simplicity of illustration. The circuit of FIG. 4 differs from the circuit of FIG. 2 in that the positions of transistors 56 and 66 have been interchanged, and the positions of transistors 58 and 68 have been interchanged. Thus, the differential outputs OUT and OUT B of the sense amplifier appear at the drains of transistors 58 and 56, respectively. The drain of transistor 66 is connected to the source of transistor 56, and the drain of transistor 68 is connected to the source of transistor 58. The sources of transistors 66 and 68 are connected to node 60. The source of transistor 84 is connected to the drain of transistor 56, which constitutes differential output OUT B. The source of transistor 86 is connected to the drain of transistor 58, which constitutes differential output OUT.

The operation of the sense amplifier of FIG. 4 is substantially the same as the operation of the sense amplifier shown in FIG. 2 and described above. The offset error of the differential amplifier is nulled by the combination of transistors 66, 68, 84 and 86 and capacitors 80 and 82. The embodiment of FIG. 4 permits a somewhat higher precharge voltage VP (see FIG. 2) to be applied to the Bit line 50 and the Bit B line 52.

Figure 5:
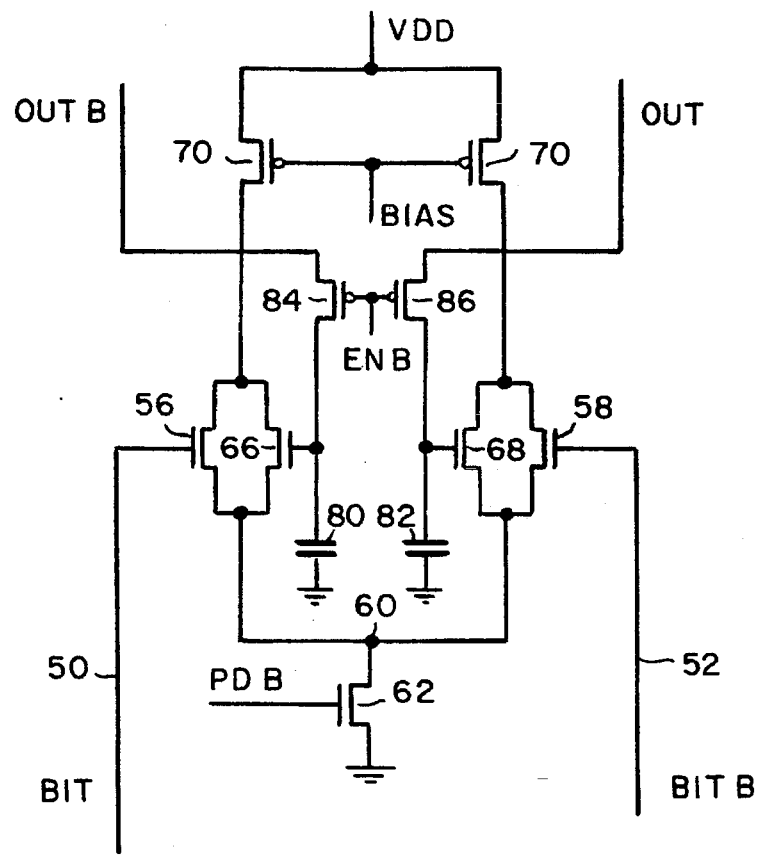
FIG. 5 is a schematic diagram of a third embodiment of the sense amplifier of the present invention.

A third embodiment of the sense amplifier of the present invention is shown in FIG. 5. Like elements in FIGS. 2 and 5 have the same reference numerals. The memory cell 54, the bit line equalization circuit 90, the control circuit 98 and the second stage 74 have been omitted from FIG. 5 for simplicity of illustration. The sense amplifier of FIG. 5 differs from the sense amplifier of FIG. 2 in that transistors 56 and 66 are connected in parallel, and transistors 58 and 68 are connected in parallel. More particularly, the drains of transistors 56 and 66 are connected together and constitute differential output OUT B. The sources of transistors 56 and 66 are connected to node 60. The drains of transistors 58 and 68 are connected together and constitute differential output OUT. The sources of transistors 58 and 68 are connected to node 60. Transistor 84 is connected between differential output OUT B and the gate of transistor 66, and transistor 86 is connected between differential output OUT and the gate of transistor 68. The third embodiment has higher gain at the expense of different layout constraints, which may be beneficial if it is necessary for a sense amplifier to match the spacing between one bit line pair (or a group, if multiplexed), for efficient area utilization.

The operation of the sense amplifier of FIG. 5 is substantially the same as the operation of the sense amplifier shown in FIG. 2 and described above. In the sense amplifier of FIG. 5, the total current in each leg of the differential amplifier is divided between the parallel connected transistors.

In each of the sense amplifiers shown and described above, the differential outputs of the sense amplifier are controlled in part by the bit line voltages and in part by the offset error of the differential amplifier. Because the offset error is nulled, the access time of the memory cell is reduced. Offset nulling in accordance with the present invention permits longer bit lines and thus reduced word line population for a given memory size. This reduces word line activation time, thus further reducing access time. Additionally, different memory aspect ratios, defined here as the number of columns divided by the number of rows, can be employed for embedded applications, which must be pitch matched to other circuit blocks to efficiently utilize silicon area.

The sense amplifier of the present invention has been described in connection with a CMOS implementation. It will be understood that the technique of offset error nulling shown and described herein can be applied to other technologies such as, for example, BICMOS and bipolar technologies.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A sense amplifier for determining the state of a memory cell of a random access memory, said memory cell having Bit and Bit B lines connected thereto, comprising:

first and second transistors connected in a differential amplifier configuration, said first and second transistors having control electrodes coupled to the Bit and Bit B lines, respectively, for sensing the state of the memory cell;

third and fourth transistors connected in said differential amplifier configuration, said third and fourth transistors each having a control electrode, said differential amplifier configuration having an offset error and providing differential outputs for indicating the state of the memory cell during a read phase;

first and second capacitors respectively coupled between the control electrodes of said third and fourth transistors and a reference potential;

a feedback circuit for coupling voltages representative of the offset error to said first and second capacitors during a nulling phase in which the Bit and Bit B lines are not being read; and a bias circuit for biasing said first, second, third and fourth transistors for operation during the read phase and the nulling phase.

2. A sense amplifier as defined in claim 1 wherein said feedback circuit comprises a fifth transistor coupled between one of said differential outputs and said first capacitor, a sixth transistor coupled between the other of said differential outputs and said second capacitor, and a control circuit for switching said fifth and sixth transistors on during said nulling phase and for switching said fifth and sixth transistors off during said read phase.

3. A sense amplifier as defined in claim 1 wherein said third transistor is connected in series with said first transistor in a cascode arrangement, and said fourth transistor is connected in series with said second transistor in a cascode arrangement.

4. A sense amplifier as defined in claim 1 wherein said third transistor is connected in parallel with said first transistor, and said fourth transistor is connected in parallel with said second transistor.

5. A sense amplifier as defined in claim 1 further including a bit line equalization circuit coupled to the Bit and Bit B lines for precharging the Bit and Bit B lines to equal voltages during a precharge phase.

6. A sense amplifier as defined in claim 5 wherein said nulling phase and said precharge phase are concurrent.

7. A sense amplifier for determining the state of a memory cell of a random access memory, said memory cell having Bit and Bit B lines connected thereto, comprising:

first and second transistors connected in a differential amplifier configuration, said first and second transistors having gates coupled to the Bit and Bit B lines, respectively, for sensing the state of the memory cell;

third and fourth transistors connected in said differential amplifier configuration, said third and fourth transistors each having a drain and a gate, said differential amplifier configuration having first and second differential outputs for indicating the state of the memory cell during a read phase;

first and second capacitors respectively coupled between the gates of said third and fourth transistors and a reference potential;

a feedback circuit for coupling said first and second differential outputs to the gates of said third and fourth transistors, respectively, during a nulling phase in which the Bit and Bit B lines are not being read; and a bias circuit for biasing said first, second, third and fourth transistors for operation during said read phase and said nulling phase.

8. A sense amplifier as defined in claim 7 wherein said feedback circuit comprises a fifth transistor coupled between said first differential output and the gate of said third transistor, a sixth transistor coupled between said second differential output and the gate of said fourth transistor, and a control circuit for switching said fifth and sixth transistors on during said nulling phase and for switching said fifth and sixth transistors off during said read phase.

9. A sense amplifier as defined in claim 7 further including a bit line equalization circuit coupled to the Bit and Bit B lines for precharging the Bit and Bit B lines to equal voltages during a precharge phase.

10. A sense amplifier as defined in claim 9 wherein said nulling phase and said precharge phase are concurrent.

11. A sense amplifier as defined in claim 7 wherein said first and second capacitors are respectively coupled between the gates of said third and fourth transistors and ground.

12. A sense amplifier for determining the state of a memory cell of a random access memory, said memory cell having Bit and Bit B lines connected thereto, comprising:

first and second transistors connected in a differential amplifier configuration, said first and second transistors having gates coupled to the Bit and Bit B lines, respectively, for sensing the state of the memory cell;

third and fourth transistors connected in series with said first and second transistors, respectively, said third and fourth transistors each having a drain and a gate, the drains of said third and fourth transistors constituting first and second differential outputs for indicating the state of the memory cell during a read phase;

first and second capacitors respectively coupled between the gates of said third and fourth transistors and a reference potential;

a feedback circuit for coupling said first and second differential outputs to the gates of said third and fourth transistors, respectively, during a nulling phase in which the Bit and Bit B lines are not being read; and a bias circuit for biasing said first, second, third and fourth transistors for operation during said read phase and said nulling phase.

13. A sense amplifier as defined in claim 12 wherein said feedback circuit comprises a fifth transistor coupled between said first differential output and the gate of said third transistor, a sixth transistor coupled between said second differential output and the gate of said fourth transistor, and a control circuit for switching said fifth and sixth transistors on during said nulling phase and for switching said fifth and sixth transistors off during said read phase.

14. A sense amplifier for determining the state of a memory cell of a random access memory, said memory cell having Bit and Bit B lines connected thereto, comprising:

first and second transistors connected in a differential amplifier configuration, said first and second transistors each having a drain and a gate, said first and second transistors having said gates coupled to the Bit and Bit B lines, respectively, for sensing the state of the memory cell, the drains of said first and second transistors constituting first and second differential outputs for indicating the state of the memory cell during a read phase;

third and fourth transistors connected in series with said first and second transistors respectively, said third and fourth transistors each having a gate;

first and second capacitors respectively coupled between the gates of said third and fourth transistors and a reference potential;

a feedback circuit for coupling said first and second differential outputs to the gates of said third and fourth transistors, respectively, during a nulling phase in which the Bit and Bit B lines are not being read; and a bias circuit for biasing said first, second, third and fourth transistors for operation during said read phase and said nulling phase.

15. A sense amplifier as defined in claim 14 wherein said feedback circuit comprises a fifth transistor coupled between said first differential output and the gate of said third transistor, a sixth transistor coupled between said second differential output and the gate of said fourth transistor, and a control circuit for switching said fifth and sixth transistors on during said nulling phase and for switching said fifth and sixth transistors off during said read phase.

16. A sense amplifier for determining the state of a memory cell of a random access memory, said memory cell having Bit and Bit B lines connected thereto, comprising:

first and second transistors connected in a differential amplifier configuration, said first and second transistors each having a drain and a gate, said first and second transistors having said gates coupled to the Bit and Bit B lines, respectively, for sensing the state of the memory cell;

third and fourth transistors connected in parallel with said first and second transistors, respectively, said third and fourth transistors each having a drain and a gate, the drains of said first and third transistors constituting a first differential output, and the drains of said second and fourth transistors constituting a second differential output, said first and second differential outputs indicating the state of the memory cell during a read phase;

first and second capacitors respectively coupled between the gates of said third and fourth transistors and a reference potential;

a feedback circuit for coupling said first and second differential outputs to the gates of said third and fourth transistors, respectively, during a nulling phase in which the Bit and Bit B lines are not being read; and a bias circuit for biasing said first, second, third and fourth transistors for operation during said read phase and said nulling phase.

17. A sense amplifier as defined in claim 16 wherein said feedback circuit comprises a fifth transistor coupled between said first differential output and the gate of said third transistor, a sixth transistor coupled between said second differential output and the gate of said fourth transistor, and a control circuit for switching said fifth and sixth transistors on during said nulling phase and for switching said fifth and sixth transistors off during said read phase.

* * * * *